United States Patent
Huang et al.

(10) Patent No.: US 10,103,647 B2
(45) Date of Patent: Oct. 16, 2018

(54) SENSORLESS MEASUREMENT METHOD AND DEVICE FOR FILTER CAPACITOR CURRENT BY USING A STATE OBSERVER

(71) Applicant: INDUSTRIAL TECHNOLOGY RESEARCH INSTITUTE, Hsinchu (TW)

(72) Inventors: Shu-Syuan Huang, Xihu Township, Changhua County (TW); Yoshihiro Konishi, Hsinchu (TW); Zong-Zhen Yang, Kaohsiung (TW); Min-Ju Hsieh, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 76 days.

(21) Appl. No.: 15/354,528

(22) Filed: Nov. 17, 2016

(65) Prior Publication Data
US 2018/0054139 A1 Feb. 22, 2018

(30) Foreign Application Priority Data
Aug. 17, 2016 (TW) .............................. 105126234 A

(51) Int. Cl.
H03K 3/017 (2006.01)
H03K 5/04 (2006.01)
(Continued)

(52) U.S. Cl.
CPC ...... *H02M 7/53871* (2013.01); *G01R 19/003* (2013.01); *G01R 19/2509* (2013.01); *H02M 1/14* (2013.01); *H02M 2001/0009* (2013.01)

(58) Field of Classification Search
CPC .............. H02M 7/53871; H02M 1/14; H02M 2001/0009; G01R 19/003; G01R 19/2509
(Continued)

(56) References Cited

U.S. PATENT DOCUMENTS 8,350,397 B2 1/2013 Lang et al.
8,436,573 B2 5/2013 Uryu et al.
(Continued)

FOREIGN PATENT DOCUMENTS

CN 101505109 B 12/2010
CN 102611382 A 7/2012
(Continued)

OTHER PUBLICATIONS

T. Yokoyama and A. Kawamura, "Disturbance observer based fully digital controlled PWM inverter for CVCF operation," in *IEEE Transactions on Power Electronics*, vol. 9, No. 5, Sep. 1994, pp. 473-480.
(Continued)

*Primary Examiner* — Lincoln Donovan
*Assistant Examiner* — Metasebia Retebo
(74) *Attorney, Agent, or Firm* — Muncy, Geissler, Olds & Lowe, P.C.

(57) ABSTRACT

A sensorless measurement device for filter capacitor current by using a state observer is provided. The sensorless measurement device comprises a chip, wherein the chip comprises the state observer. The state observer is configured to retrieve a filter-capacitor-voltage actual value and a direct current link (dc-link) voltage of a present sampling time. According to the filter-capacitor-voltage actual value and the dc-link voltage, the state observer is configured to output a filter-capacitor-voltage state variable value, a filter-capacitor-current state variable value, and a disturbance-voltage state variable value of a next sampling time. The filter-capacitor-current state variable value is an average current value without ripples.

11 Claims, 9 Drawing Sheets

(51) Int. Cl.
*H03K 7/08* (2006.01)
*H02M 7/5387* (2007.01)
*G01R 19/00* (2006.01)
*G01R 19/25* (2006.01)
*H02M 1/14* (2006.01)
*H02M 1/00* (2006.01)

(58) Field of Classification Search
USPC .......................................................... 327/175
See application file for complete search history.

(56) References Cited

U.S. PATENT DOCUMENTS

| | | | |
|---|---|---|---|
| 8,487,600 | B2 | 7/2013 | Prodic et al. |
| 8,536,842 | B2 | 9/2013 | Prodic et al. |
| 9,118,247 | B2 | 8/2015 | Alexander |
| 9,722,523 | B2 * | 8/2017 | Lee .................. H02P 21/36 |
| 2013/0033907 | A1 | 2/2013 | Zhou et al. |
| 2015/0263603 | A1 | 9/2015 | Pahlevaninezhad et al. |
| 2015/0311833 | A1 | 10/2015 | Bai et al. |
| 2015/0357945 | A1 | 12/2015 | Takahashi et al. |
| 2016/0173012 | A1 | 6/2016 | Nondahl et al. |

FOREIGN PATENT DOCUMENTS

| | | |
|---|---|---|
| CN | 101964624 B | 8/2012 |
| CN | 103368281 A | 10/2013 |
| CN | 103516182 A | 1/2014 |
| CN | 103684028 A | 3/2014 |
| CN | 203562976 U | 4/2014 |
| CN | 203674732 U | 6/2014 |
| CN | 104022511 A | 9/2014 |
| CN | 104426392 A | 3/2015 |
| CN | 104467005 A | 3/2015 |
| CN | 104601076 A | 5/2015 |
| CN | 104682581 A | 6/2015 |
| CN | 104734580 A | 6/2015 |
| CN | 204529967 U | 8/2015 |
| CN | 104901572 A | 9/2015 |
| CN | 105099254 A | 11/2015 |
| JP | H04145809 A | 5/1992 |
| JP | 2005229717 A | 8/2005 |
| TW | I253227 B | 4/2006 |
| TW | I275226 B | 3/2007 |
| TW | 200836469 A | 9/2008 |
| TW | 201128915 A | 8/2011 |
| TW | 201212463 A | 3/2012 |
| TW | 201244527 A | 11/2012 |
| TW | I399695 B | 6/2013 |
| TW | I437807 B | 5/2014 |
| TW | I443956 B | 7/2014 |
| TW | I462457 B | 11/2014 |
| TW | I482411 B | 4/2015 |
| TW | I485962 B | 5/2015 |
| TW | I501530 B | 9/2015 |
| TW | I519054 B | 1/2016 |
| TW | I540933 B | 7/2016 |
| WO | WO2016015329 A1 | 2/2016 |

OTHER PUBLICATIONS

Y. Ito and S. Kawauchi, "Microprocessor based robust digital control for UPS with three-phase PWM inverter," in IEEE Transactions on Power Electronics, vol. 10, No. 2, Mar. 1995., pp. 196-204.

Yuan Yisheng, Liuchen Chang and Song Pinggang, "Development of a current-sensorless multi-loop control for standalone PWM inverters," 2007 7th Internatonal Conference on Power Electronics, Daegu, Oct. 22-26, 2007, pp. 598-601.

M. J. Ryan, W. E. Brumsickle and R. D. Lorenz, "Control topology options for single-phase UPS inverters," in *IEEE Transactions on Industry Applications*, vol. 33, No. 2, Mar./Apr. 1997, pp. 493-501.

Poh Chiang Loh, M. J. Newman, D. N. Zmood and D. G. Holmes, "A comparative analysis of multiloop voltage regulation strategies for single and three-phase UPS systems," in *IEEE Transactions on Power Electronics*, vol. 18, No. 5, Sep. 2003, pp. 1176-1185.

X. Zhou, Y. Liu, S. Bhattacharya and A. Huang, "New inductor current feedback control with active harmonics injection for inverter stage of solid state transformer," IECON 2010—36th Annual Conference on IEEE Industrial Electronics Society, Glendale, AZ, 2010, pp. 593-598.

\* cited by examiner

SENSORLESS MEASUREMENT METHOD AND DEVICE FOR FILTER CAPACITOR CURRENT BY USING A STATE OBSERVER

CROSS-REFERENCE TO RELATED APPLICATION

This application claims the priority benefits of a Taiwan application serial No. 105126234, entitled "SENSORLESS MEASUREMENT METHOD AND DEVICE FOR FILTER CAPACITOR CURRENT BY USING A STATE OBSERVER" and filed on Aug. 17, 2016. The entirety of the above-mentioned application is hereby incorporated by reference herein.

TECHNICAL FIELD

The technical field relates to a sensorless measurement method and a device for filter capacitor current by using a state observer.

BACKGROUND

There are various control methods for direct current to alternating current (DC-AC) converters. In these methods, there are three kinds of controlled current, such as filter inductor current, filter capacitor current, and load current. According to some researches about the control methods, a system controlled by the filter capacitor current has better performance as a whole. Not only cheaper detection devices or circuitry can be utilized to the system, but the dynamic response of the system is better. However, the filter capacitor current itself has ripples. Because of the ripples, accuracy of measurement shall be concerned.

In general, there are few measurement methods for the filter capacitor current, such as direct detection and indirect detection. In the direct detection of filter capacitor current, a hardware detection circuit is utilized to directly measure the filter capacitor current. Values of the filter capacitor current are determined by impedance values of filter capacitors. Since the impedance values of the filter capacitors are usually small, values of the filter capacitor current are also small. Thus, cheaper detection devices can be used in the direct detection. However, the filter capacitor current itself has ripples. If accurate signals are needed, a filter circuit shall be equipped additionally. However, the filter circuit may bring out a signal distortion and delay problems.

There are two methods in the indirect detection. One method is detecting the filter inductor current and the load current by using hardware circuits in advance. The filter capacitor current is the difference value between the filter inductor current and the load current. This method requires at least two detection devices having a wide bandwidth. Therefore, costs of the detection devices or the circuitry are still high and there still exists the delay problems.

SUMMARY

The present disclosure provides a sensorless measurement method for filter capacitor current by using a state observer. In one embodiment, the sensorless measurement method comprises receiving a filter-capacitor-voltage actual value of a present sampling time; receiving a dc-link voltage of the present sampling time; outputting, by the state observer, a filter-capacitor-voltage state variable value, according to the filter-capacitor-voltage actual value and the dc-link voltage, wherein the filter-capacitor-voltage state variable value is a predicted voltage value of a next sampling time; and outputting, by the state observer, a filter-capacitor-current state variable value, wherein the filter-capacitor-current state variable value is a predicted current value of the next sampling time, and the filter-capacitor-current state variable value is an average current value without ripples.

The present disclosure provides a sensorless measurement method for filter capacitor current by using a state observer. In another embodiment, the sensorless measurement method comprises detecting a filter-capacitor-voltage actual value and a direct current link (dc-link) voltage of a present sampling time; calculating, by the state observer, a filter-capacitor-voltage state variable value, a filter-capacitor-current state variable value, and a disturbance-voltage state variable value of a next sampling time; comparing a filter-capacitor-voltage command value with the filter-capacitor-voltage state variable value, and obtaining a filter-capacitor-current command value; comparing the filter-capacitor-current command value with the filter-capacitor-current state variable value, and obtaining a voltage control value; comparing the voltage control value with a feed-forward-voltage state variable value, and obtaining a pulse-width-modulation comparison value, wherein the feed-forward-voltage state variable value equals the disturbance-voltage state variable value divided by the dc-link voltage; and proceeding a switch control of pulse-width-modulation according to the pulse-width-modulation comparison value.

The present disclosure provides a sensorless measurement device for filter capacitor current by using a state observer. Yet in another embodiment, the sensorless measurement device comprises a chip, wherein the chip comprises the state observer. The state observer is configured to retrieve a filter-capacitor-voltage actual value and a direct current link (dc-link) voltage of a present sampling time. According to the filter-capacitor-voltage actual value and the dc-link voltage, the state observer is configured to output a filter-capacitor-voltage state variable value, a filter-capacitor-current state variable value, and a disturbance-voltage state variable value of a next sampling time. The filter-capacitor-current state variable value is an average current value without ripples.

DETAILED DESCRIPTION OF DISCLOSED EMBODIMENTS

Figure 1:
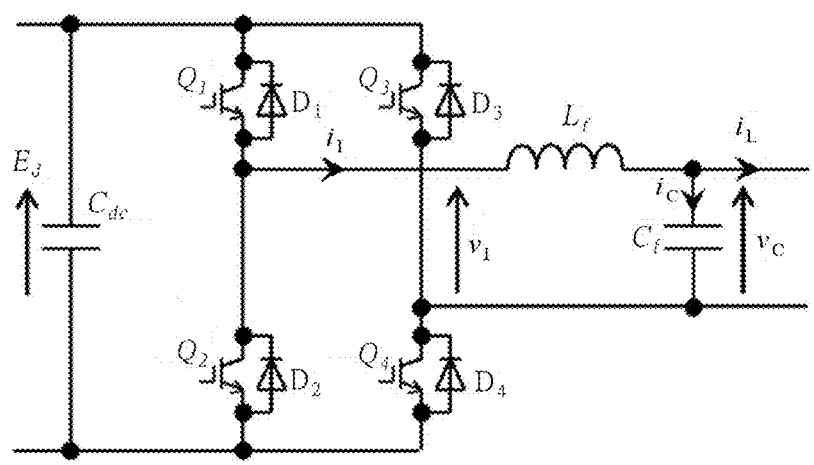
FIG. 1 illustrates a circuit configuration of a single phase DC-AC converter in accordance with an embodiment of the present disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The present disclosure provides a state observer for predicting and calculating a filter capacitor current at the AC side of DC-AC converters.

The measurement method of the present disclosure adopts a method of indirect detection and digital calculation. By using the digital schema, values of filter capacitor current are retrieved. There is no need to use additional hardware circuitry so that costs of the detection devices or the circuitry decrease. In addition, signals are not distorted and carry no ripple composition so that the accuracy of the detection is good.

In the present disclosure, circuit formulas of filter capacitor voltage, filter capacitor current, and disturbance voltage are derived through the circuit analysis. Besides, continuous signals are transformed into discrete signals by transform functions. Thus, mathematical formulas of filter capacitor voltage, filter capacitor current, and disturbance voltage are further derived. In the mathematical formulas, only actual values of filter capacitor voltage and dc-link voltage are required to be detected, predict values of the filter capacitor voltage, the filter capacitor current, and the disturbance voltage may be calculated and obtained. The values of filter capacitor current are average current values without ripples. There is no need to directly detect values of the filter capacitor current of a present sampling time, but still obtain values of filter capacitor current of a next sampling time. As such, there is no need to equip additional hardware circuitry for the filter capacitor current so that costs of detection devices or circuitry relatively decrease. For a digital control system, the calculation results of the state observer are referred to as predicted values of a next sampling time. This may reduce errors of sampling time, therefore the overall performance of the digital control system is improved.

State observers are divided into open-loop state observers and close-loop state observers. The difference between them is that the close-loop state observers have signal feedback to reduce calculation errors. The calculation errors of the close-loop state observers are less than those of the open-loop state observers. Thus, the present disclosure adopts the close-loop state observers. Formula (1) is a mathematical formula of an open-loop state observer. Formula (2) is a mathematical formula of a close-loop state observer. In order to obtain the close-loop state observer, the open-loop state observer shall be derived in advance. There are detailed derivation as follows.

$$\dot{\hat{x}} = A\hat{x} + Bu, y = C\hat{x}, \quad \text{formula (1)}$$

$$\dot{\hat{x}} = A\hat{x} + Bu + K(y - C\hat{x}), y = C\hat{x} \quad \text{formula (2)}$$

Formulas (1) and (2) are general formulas. Labels A, B, and C are regarded as coefficients. Label K is a gain term. Labels $\dot{\hat{x}}$ and $\hat{x}$ respectively represents state variable values of a next sampling time and a present sampling time. Label u represents system modulation indexes. Label y represents actual feedback values. Detailed interpretation is as follows.

The present disclosure provides a sensorless measurement method for filter capacitor current by using a state observer. The state observer is applicable to single phase DC-AC converters. The present disclosure takes single phase full bridge converters for example. FIG. 1 illustrates a circuit configuration of a single phase DC-AC converter 100 in accordance with an embodiment of the present disclosure. The single phase DC-AC converter 100 comprises four semiconductor transistors $Q_1$-$Q_4$, a filter inductor $L_f$, a filter capacitor $C_f$, and diodes $D_1$-$D_4$ associated with semiconductor transistors $Q_1$-$Q_4$. Label $E_d$ represents a dc-link voltage. Label $v_I$ represents a AC voltage output from converter. Label $i_I$ represents a current output from converter. Label $v_C$ represents a filter capacitor voltage. Label $i_C$ represents a filter capacitor current. Label $i_L$ represents a load current.

Referring to FIG. 1, formulas (3) and (4) may be derived according to circuit principles.

$$v_I = v_{Lf} + v_C = L_f \frac{di_I}{dt} + v_C, \quad \text{formula (3)}$$

$$i_I = i_C + i_L = C_f \frac{dv_C}{dt} + i_L, \quad \text{formula (4)}$$

Label $$L_f \frac{di_I}{dt}$$

represents a filter-inductor-voltage relational expression. Label $$C_f \frac{dv_C}{dt}$$

represents a filter-capacitor-current relational expression. Label $L_f$ represents a filter inductor. Label $C_f$ represents a filter capacitor. Label $v_{Lf}$ represents a filter inductor voltage. Label $v_I$ represents a AC voltage output from converter. Label $i_I$ represents a current output from converter. Label $v_C$ represents a filter capacitor voltage. Label $i_C$ refers to a filter capacitor current. Label $i_L$ represents a load current. Except some constants, the aforementioned values are continuous physical quantities herein. Formulas (3) and (4) are derived into state equations and shown as formula (5).

$$\frac{d}{dt}\begin{pmatrix} v_C \\ i_I \end{pmatrix} = \begin{pmatrix} 0 & 1/C_f \\ -1/L_f & 0 \end{pmatrix}\begin{pmatrix} v_C \\ i_I \end{pmatrix} + \begin{pmatrix} 0 \\ E_d/L_f \end{pmatrix}u + \begin{pmatrix} -1/C_f \\ 0 \end{pmatrix}i_L; \quad \text{formula (5)}$$

$$v_C = (1 \ 0)\begin{pmatrix} v_C \\ i_I \end{pmatrix},$$

Label u represents system modulation indexes, wherein the AC voltage output from converter $v_I$ equals the system modulation indexes u multiplied by the dc-link voltage $E_d$, shown as $v_I = uE_d$. Label $E_d$ represents the dc-link voltage. Label $L_f$ represents the filter inductor. Label $C_f$ represents the filter capacitor. Except some constants, the aforementioned values are continuous physical quantities herein. Formula (5) represents a state equation between the filter capacitor voltage $v_C$ and the current output from converter $i_I$. In order to derive a state equation of the filter capacitor current $i_C$, the current output from converter $i_I$ is transformed into the filter capacitor current $i_C$. In order to obtain a clear relationship of every parameter, formula (5) turns into a control block diagram, shown in FIG. 2.

Figure 2:
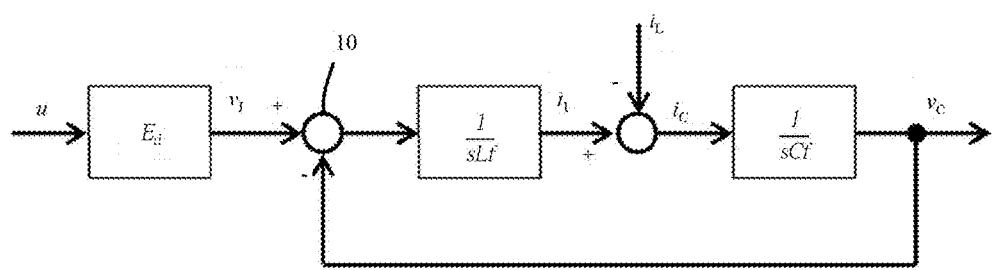
FIG. 2 illustrates a control block diagram of a single phase DC-AC converter in accordance with an embodiment of the present disclosure.

FIG. 2 illustrates a control block diagram of the single phase DC-AC converter 100 in accordance with an embodiment of the present disclosure. Referring to FIG. 2, formula (6) can be derived according to circuit principles.

$$v_I = i_I \cdot sL_f + v_C, \quad \text{formula(6)}$$

Assuming $i_C \cdot sL_f \approx 0$, formula (6) is organized and is derived as formula (7).

$$v_I = i_I \cdot sL_f + v_C = (i_L + i_C) \cdot sL_f + v_C = i_L \cdot sL_f + v_C, \quad \text{formula (7)}$$

Figure 3:
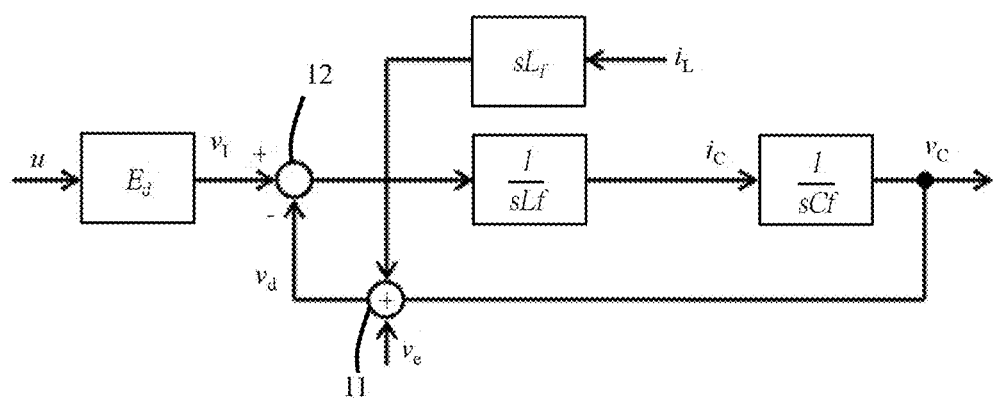
FIG. 3 is an equivalent transformation of the control block diagram of FIG. 2.

Label $sL_f$ represents a filter inductor impedance. According to the formula (7), the block diagram of FIG. 2 is rewritten into a block diagram of FIG. 3, wherein block diagrams of FIG. 2 and FIG. 3 are equivalent. Specially, the filter capacitor voltage $v_C$ acts as feedback signals, which are fed back to an adder 10. The adder 10 adds the filter capacitor voltage $v_C$ and the AC voltage output from converter $v_I$. The AC voltage output from converter $v_I$ equals the system modulation indexes u multiplied by the dc-link voltage $E_d$, shown as the mathematical formula $v_I = uE_d$.

FIG. 3 is an equivalent transformation of the control block diagram of FIG. 2. Referring to FIG. 3, label $v_e$ represents an error compensation voltage; and label $v_d$ represents a disturbance voltage. A state equation is reversely derived from the control block diagram of FIG. 3. Relative formulas of the filter capacitor voltage $v_C$ and the filter capacitor current $i_C$ may be obtained from the control block diagram of FIG. 3, as shown in formulas (8)-(10).

$$v_d = v_C + L_f \frac{di_L}{dt} + v_e, \quad \text{formula (8)}$$

$$i_C = C_f \frac{dv_C}{dt}, \quad \text{formula (9)}$$

$$L_f \frac{di_C}{dt} = v_I - v_d, \quad \text{formulas (10)}$$

Label $v_e$ represents the error compensation voltage; and label $v_d$ represents the disturbance voltage. Label $v_C$ represents the filter capacitor voltage. Label $$L_f \frac{di_L}{dt}$$

represents a filter-inductor-voltage relational expression. Label $i_C$ represents the filter capacitor current. Label $$C_f \frac{dv_C}{dt}$$

represents a filter-capacitor-current relational expression. Label $v_I$ represents the AC voltage output from converter. Except some constants, the aforementioned values are continuous physical quantities herein. Specially, the filter capacitor voltage $v_C$ acts as feedback signals, which are fed back to an adder 11. The adder 11 adds the fed back filter capacitor voltage $v_C$, feedback filter-inductor-voltage $$L_f \frac{di_L}{dt},$$

and feedback error compensation voltage $v_e$ together. The adder 11 then carries out disturbance voltage $v_d$. Further, an adder 12 adds the disturbance voltage $v_d$ and the AC voltage output from converter $v_I$. The AC voltage output from converter $v_I$ equals the system modulation indexes u multiplied by the dc-link voltage $E_d$, shown as the mathematical formula $v_I = uE_d$.

In the disclosure, two types of close-loop-state-observer formulas are provided. Commonly, in both types of the formulas, the filter capacitor voltage $v_C$ acts as feedback signals. Differently, for the first type of close loop-state-observer formula, assumes $$\frac{dv_d}{dt} = 0,$$

which means that the time-varying disturbance voltage is zero. For the second type of close-loop-state-observer formula assumes $$\frac{dv_d}{dt} = \frac{dv_C}{dt},$$

which means that the time-varying disturbance voltage equals the time-varying filter capacitor voltage. Detailed derivation and comparison are described as follows. In some embodiments, there are different kinds of assumption or derivation. In the present disclosure, two exemplary types of state observer formulas are illustrated. The main spirit is when applying the sensorless method and utilizing the state observer, values of filter capacitor current of a next sampling time may be obtained, without requiring to directly detect the values of filter capacitor current of a present sampling time. Predicted values of the filter capacitor current are average current values without ripples.

Derivation of the first-type close-loop state observer is described herein. Formulas (8) and (9) are taken and organized to state equations, and $$\frac{dv_d}{dt} = 0$$

is directly defined. This means that the time-varying disturbance voltage is zero. The state equations are shown as formulas (11) and (12).

$$\frac{d}{dt} \begin{pmatrix} v_C \\ i_C \\ v_d \end{pmatrix} = \begin{pmatrix} 0 & 1/C_f & 0 \\ 0 & 0 & -1/L_f \\ 0 & 0 & 0 \end{pmatrix} \begin{pmatrix} v_C \\ i_C \\ v_d \end{pmatrix} + \begin{pmatrix} 0 \\ E_d/L_f \\ 0 \end{pmatrix} u, \quad \text{formula (11)}$$

$$A = \begin{pmatrix} 0 & 1/C_f & 0 \\ 0 & 0 & -1/L_f \\ 0 & 0 & 0 \end{pmatrix}, B = \begin{pmatrix} 0 \\ E_d/L_f \\ 0 \end{pmatrix},$$

$$v_C = (1 \ 0 \ 0) \begin{pmatrix} v_C \\ i_C \\ v_d \end{pmatrix}, C = (1 \ 0 \ 0), \quad \text{formula (12)}$$

Referring back to formula (1) for the open-loop state observer. The formula (1) is further transformed into discrete forms and shown as formulas (13) and (14).

$$x(k+1)=A_d x(k)+B_d u(k), A_d=e^{AT}, B_d=\int_0^T e^{A\tau}Bd\tau, \quad \text{formula (13)}$$

$$y(k)=C_d x(k), \quad \text{formula (14)}$$

By using formula (13) and the Laplace transformation, coefficients $A_d$, $B_d$, and $C_d$ are calculated. Labels x(k) and x(k+1) represent discrete values, which also means digital detection values. Later, formulas (13) and (14) are substituted and rearranged to formulas (15) and (16), which are called a first type open-loop state observer.

$$\begin{pmatrix} \hat{v}_C(k+1) \\ \hat{i}_C(k+1) \\ \hat{v}_d(k+1) \end{pmatrix} = \begin{pmatrix} 1 & T/C_f & -T^2/2L_f C_f \\ 0 & 1 & -T/L_f \\ 0 & 0 & 1 \end{pmatrix} \begin{pmatrix} \hat{v}_C(k) \\ \hat{i}_C(k) \\ \hat{v}_d(k) \end{pmatrix} + \quad \text{formula (15)}$$

$$\begin{pmatrix} T^2 E_d/2L_f C_f \\ T E_d/L_f \\ 0 \end{pmatrix} u(k),$$

$$A_d = \begin{pmatrix} 1 & T/C_f & -T^2/2L_f C_f \\ 0 & 1 & -T/L_f \\ 0 & 0 & 1 \end{pmatrix}, B_d = \begin{pmatrix} T^2 E_d/2L_f C_f \\ T E_d/L_f \\ 0 \end{pmatrix}$$

$$y(k) = (1 \ 0 \ 0) \begin{pmatrix} \hat{v}_C(k) \\ \hat{i}_C(k) \\ \hat{v}_d(k) \end{pmatrix} = v_C(k), C_d = (1 \ 0 \ 0), \quad \text{formula (16)}$$

Parameters in formulas (15) and (16) are described as follows. Label T represents a sampling period. Label $\hat{v}_C(k)$ represents filter-capacitor-voltage state variable values of a present sampling time. Label $\hat{v}_C(k+1)$ represents filter-capacitor-voltage state variable values of a next sampling time. Both of $\hat{v}_C(k)$ and $\hat{v}_C(k+1)$ are also the calculation values of the state observer. Label $\hat{i}_C(k)$ represents filter-capacitor-current state variable values of a present sampling time. Label $\hat{i}_C(k+1)$ represents filter-capacitor-current state variable values of a next sampling time. Both of $\hat{i}_C(k)$ and $\hat{i}_C(k+1)$ are also the calculation values of the state observer. Label $\hat{v}_d(k)$ represents disturbance-voltage state variable values of a present sampling time. Label $\hat{v}_d(k+1)$ represents disturbance-voltage state variable values of a next sampling time. Both of $\hat{v}_d(k)$ and $\hat{v}_d(k+1)$ are also the calculation values of the state observer. Label $E_d$ represents the dc-link voltage, which is a discrete value (digital detection value). Label u(k) represents system modulation indexes. Some known constants are below. Label $L_f$ represents the filter inductor. Label $C_f$ represents the filter capacitor.

Further, a first type close-loop-state-observer formula is derived as follows. It assumes that the filter capacitor voltage $v_C$ acts as feedback signals. Formula (2), which is a close-loop state observer, then is transformed into a discrete form shown as formula (17). Label K, a gain term, is shown in formula (18).

$$\hat{x}(k+1) = A_d \hat{x}(k) + B_d u(k) + K(y(k) - C_d \hat{x}(k)), \quad \text{formula (17)}$$

$$K = \begin{pmatrix} K_1 \\ K_2 \\ K_3 \end{pmatrix}, \quad \text{formula (18)}$$

Then, formula (16) is substituted into formula (17) to obtain formula (19).

$$\hat{x}(k+1)=(A_d-KC_d)\hat{x}(k)+B_d u(k)+Kv_C(k), \quad \text{formula (19)}$$

By using the deadbeat control law, the gain term K is calculated and shown as formula (20).

$$K = \begin{pmatrix} 3 \\ 5C_f/2T \\ -L_f C_f/T^2 \end{pmatrix}, \quad \text{formula (20)}$$

The gain term K herein may be calculated by other mathematical methods. In the disclosure, the exemplary mathematical method is illustrated, but not limited thereto. Further, known parameters are substituted into formula (19). After reorganization, the first type close-loop-state-observer formula is brought out and shown as formula (21).

$$\begin{pmatrix} \hat{v}_C(k+1) \\ \hat{i}_C(k+1) \\ \hat{v}_d(k+1) \end{pmatrix} = \quad \text{formula (21)}$$

$$\begin{pmatrix} -2 & T/C_f & -T^2/2L_f C_f \\ -5C_f/2T & 1 & -T/L_f \\ L_f C_f/T^2 & 0 & 1 \end{pmatrix} \begin{pmatrix} \hat{v}_C(k) \\ \hat{i}_C(k) \\ \hat{v}_d(k) \end{pmatrix} +$$

$$\begin{pmatrix} T^2/2L_f C_f \\ T/L_f \\ 0 \end{pmatrix} E_d u(k) + \begin{pmatrix} 3 \\ 5C_f/2T \\ -L_f C_f/T^2 \end{pmatrix} v_C(k)$$

Formula (21) is also named as a first type close-loop-state-observer formula. In formula (21), label T represents a sampling period. Label $\hat{v}_C(k)$ represents the filter-capacitor-voltage state variable values of a present sampling time. Label $\hat{v}_C(k+1)$ represents the filter-capacitor-voltage state variable values of a next sampling time. Both of $\hat{v}_C(k)$ and $\hat{v}_C(k+1)$ are also the calculation values of the first type close-loop state observer. Label $\hat{i}_C(k)$ represents filter-capacitor-current state variable values of a present sampling time. Label $\hat{i}_C(k+1)$ represents filter-capacitor-current state variable values of a next sampling time. Both of $\hat{i}_C(k)$ and $\hat{i}_C(k+1)$ are also the calculation values of the first type close-loop state observer. Label $\hat{v}_d(k)$ represents disturbance-voltage state variable values of a present sampling time. Label $\hat{v}_d(k+1)$ represents disturbance-voltage state variable values of a next sampling time. Both of $\hat{v}_d(k)$ and $\hat{v}_d(k+1)$ are also the calculation values of the first type close-loop state observer. Label $v_C(k)$ represents filter-capacitor-voltage actual values of a present sampling time. Label T represents a sampling period. Label $E_d$ represents the dc-link voltage, which is a discrete value (digital detection value). Label u(k) represents system modulation indexes. Some known constants are below. Label $L_f$ represents the filter inductor. Label $C_f$ represents the filter capacitor. Therefore, only the filter-capacitor-voltage actual values $v_C(k)$ and the dc-link voltage $E_d$ of a present sampling time need to be obtained for the first type close-loop state observer. After calculation of the first type close-loop state observer through formula (21), the filter-capacitor-voltage state variable values $\hat{v}_C(k+1)$, the filter-capacitor-current state variable values $\hat{i}_C(k+1)$, and the disturbance-voltage state variable values $\hat{v}_d(k+1)$ of a next sampling time may be calculated and obtained. Accordingly, the filter-capacitor-voltage state variable values $\hat{v}_C(k+1)$, the filter-capacitor-current state variable values $\hat{i}_C(k+1)$, and the disturbance-voltage state variable values $\hat{v}_d(k+1)$ may be known and be the predicted values at the next sampling time. Specially, the filter-capacitor-current state variable values $\hat{i}_C(k+1)$ are average current values without ripples. As such, there is no need to equip additional hardware circuitry or sensors for detecting the filter capacitor current. By using sensorless first type close-loop state observer, costs of entire system or total circuitry relatively decrease. For a digital control system, calculation results of the first type close-loop state observer contribute predicted values of a next sampling time. As such, errors of sampling time may be reduced so that the overall performance of the digital control system is improved.

Derivation of a second type state observer is described herein, which is similar to the first type state observer aforementioned. Differently, the second type state observer takes different state equations, wherein formulas (9) and (10) are taken and reorganized to state equations. And, $$\frac{dv_d}{dt} = \frac{dv_C}{dt}$$

is defined, it means that time-varying disturbance voltage equals time-varying filter capacitor voltage. Formulas (9) and (10) are organized to state equations shown as formulas (22) and (23).

$$\frac{d}{dt}\begin{pmatrix} v_C \\ i_C \\ v_d \end{pmatrix} = \begin{pmatrix} 0 & 1/C_f & 0 \\ 0 & 0 & -1/L_f \\ 0 & 1/C_f & 0 \end{pmatrix} \begin{pmatrix} v_C \\ i_C \\ v_d \end{pmatrix} + \begin{pmatrix} 0 \\ E_d/L_f \\ 0 \end{pmatrix} u \quad \text{formula (22)}$$

$$A = \begin{pmatrix} 0 & 1/C_f & 0 \\ 0 & 0 & -1/L_f \\ 0 & 1/C_f & 0 \end{pmatrix}, B = \begin{pmatrix} 0 \\ E_d/L_f \\ 0 \end{pmatrix},$$

$$v_C = (1\ 0\ 0)\begin{pmatrix} v_C \\ i_C \\ v_d \end{pmatrix}, C = (1\ 0\ 0), \quad \text{formula (23)}$$

Further, discrete forms of open-loop state observers shown as formulas (13) and (14) are utilized. By using formula (13) and the Laplace transformation, coefficients $A_d$, $B_d$, and $C_d$ are calculated. Later, coefficients $A_d$, $B_d$, and $C_d$ are substituted into formulas (13) and (14). After organization, formulas (24) and (25) are brought out and called as the second type open-loop state observer.

$$\begin{pmatrix} \hat{v}_C(k+1) \\ \hat{i}_C(k+1) \\ \hat{v}_d(k+1) \end{pmatrix} = \begin{pmatrix} 1 & \frac{\sin\omega_f T}{\omega_f C_f} & \cos\omega_f T - 1 \\ 0 & \cos\omega_f T & -\frac{\sin\omega_f T}{\omega_f L_f} \\ 0 & \frac{\sin\omega_f T}{\omega_f C_f} & \cos\omega_f T \end{pmatrix} \begin{pmatrix} \hat{v}_C(k) \\ \hat{i}_C(k) \\ \hat{v}_d(k) \end{pmatrix} + \begin{pmatrix} E_d(1 - \cos\omega_f T) \\ E_d \frac{\sin\omega_f T}{\omega_f L_f} \\ E_d(1 - \cos\omega_f T) \end{pmatrix} u(k) \quad \text{formula (24)}$$

$$\omega_f = \frac{1}{\sqrt{L_f C_f}},$$

$$A_d = \begin{pmatrix} 1 & \frac{\sin\omega_f T}{\omega_f C_f} & \cos\omega_f T - 1 \\ 0 & \cos\omega_f T & -\frac{\sin\omega_f T}{\omega_f L_f} \\ 0 & \frac{\sin\omega_f T}{\omega_f C_f} & \cos\omega_f T \end{pmatrix}, \quad \text{formula (25)}$$

$$B_d = \begin{pmatrix} E_d(1 - \cos\omega_f T) \\ E_d \frac{\sin\omega_f T}{\omega_f L_f} \\ E_d(1 - \cos\omega_f T) \end{pmatrix}$$

$$y(k) = (1\ 0\ 0)\begin{pmatrix} \hat{v}_C(k) \\ \hat{i}_C(k) \\ \hat{v}_d(k) \end{pmatrix} = v_C(k), C_d = (1\ 0\ 0),$$

Parameters in formulas (24) and (25) are described as follows. Label T represents a sampling period. Label $\omega_f$ represents filter angular frequencies. Label $\hat{v}_C(k)$ represents filter-capacitor-voltage state variable values of a present sampling time. Label $\hat{v}_C(k+1)$ represents filter-capacitor-voltage state variable values of a next sampling time. Both of $\hat{v}_C(k)$ and $\hat{v}_C(k+1)$ are calculation values of the state observer. Label $\hat{i}_C(k)$ represents filter-capacitor-current state variable values of a present sampling time. Label $\hat{i}_C(k+1)$ represents filter-capacitor-current state variable values of a next sampling time. Both of $\hat{i}_C(k)$ and $\hat{i}_C(k+1)$ are calculation values of the state observer. Label $\hat{v}_d(k)$ represents disturbance-voltage state variable values of a present sampling time. Label $\hat{v}_d(k+1)$ represents disturbance-voltage state variable values of a next sampling time. Both of $\hat{v}_d(k)$ and $\hat{v}_d(k+1)$ are calculation values of the state observer. Label $E_d$ represents the dc-link voltage, which is a discrete value (digital detection value). Label u(k) represents system modulation indexes. Some known constants are below. Label $L_f$ represents the filter inductor. Label $C_f$ represents the filter capacitor.

Further, by using formulas (24) and (25) of the second type open-loop state observer, a second type close-loop-state-observer formula is derived below. Assuming that the filter capacitor voltage $v_C$ acts as feedback signals, a discrete form of an open-loop state observers shown as formula (19) is utilized. By using the deadbeat control law, the gain term K is calculated and shown as formula (26).

$$K = \begin{pmatrix} 1 + 2\cos\omega_f T \\ \frac{\omega_f C_f (4\cos^2\omega_f T + 2\cos\omega_f T - 1)}{2\sin\omega_f T} \\ \frac{(2\cos\omega_f T - 4\cos^2\omega_f T + 1)}{2(1 - \cos\omega_f T)} \end{pmatrix}, \quad \text{formula (26)}$$

The gain term K herein may be calculated by other mathematical methods. In the disclosure, the exemplary mathematical method is illustrated, but not limited thereto. Further, known parameters are substituted into formula (19). After the aforesaid organization, a second type close-loop-state-observer formula is brought out and shown as formula (27). Formula (27) is also called as a second type close-loop-state-observer formula.

formula (27)

$$\begin{pmatrix} \hat{v}_C(k+1) \\ \hat{i}_C(k+1) \\ \hat{v}_d(k+1) \end{pmatrix} =$$

$$\begin{pmatrix} -2\cos\omega_f T & \dfrac{\sin\omega_f T}{\omega_f C_f} & \cos\omega_f T - 1 \\ -\dfrac{\omega_f C_f(4\cos^2\omega_f T + 2\cos\omega_f T - 1)}{2\sin\omega_f T} & \cos\omega_f T & -\dfrac{\sin\omega_f T}{\omega_f L_f} \\ -\dfrac{(2\cos\omega_f T - 4\cos^2\omega_f T + 1)}{2(1-\cos\omega_f T)} & \dfrac{\sin\omega_f T}{\omega_f C_f} & \cos\omega_f T \end{pmatrix} \begin{pmatrix} \hat{v}_C(k) \\ \hat{i}_C(k) \\ \hat{v}_d(k) \end{pmatrix} +$$

$$\begin{pmatrix} 1 - \cos\omega_f T \\ \dfrac{\sin\omega_f T}{\omega_f L_f} \\ 1 - \cos\omega_f T \end{pmatrix} E_d u(k) + \begin{pmatrix} 1 + 2\cos\omega_f T \\ \dfrac{\omega_f C_f(4\cos^2\omega_f T + 2\cos\omega_f T - 1)}{2\sin\omega_f T} \\ \dfrac{(2\cos\omega_f T - 4\cos^2\omega_f T + 1)}{2(1-\cos\omega_f T)} \end{pmatrix} v_C(k),$$

In the formulas (26) and (27), label T represents a sampling period. Label $\omega_f$ represents filter angular frequencies. Label $\hat{v}_C(k)$ represents filter-capacitor-voltage state variable values of a present sampling time. Label $\hat{v}_C(k+1)$ represents filter-capacitor-voltage state variable values of a next sampling time. Both of $\hat{v}_C(k)$ and $\hat{v}_C(k+1)$ are calculation values of the second type close-loop state observer. Label $\hat{i}_C(k)$ represents filter-capacitor-current state variable values of a present sampling time. Label $\hat{i}_C(k+1)$ represents filter-capacitor-current state variable values of a next sampling time. Both of $\hat{i}_C(k)$ and $\hat{i}_C(k+1)$ are calculation values of the second type close-loop state observer. Label $\hat{v}_d(k)$ represents disturbance-voltage state variable values of a present sampling time. Label $\hat{v}_d(k+1)$ represents disturbance-voltage state variable values of a next sampling time. Both of $\hat{i}_C(k)$ and $\hat{i}_C(k+1)$ are calculation values of the second type close-loop state observer. Label $v_C(k)$ represents filter-capacitor-voltage actual values of a present sampling time. Label $u(k)$ represents system modulation indexes. Label $E_d$ represents the dc-link voltage, which is a discrete value (digital detection value). Label $u(k)$ represents system modulation indexes. Some known constants are below. Label $L_f$ represents the filter inductor. Label $C_f$ represents the filter capacitor.

In accordance with formulas (26) and (27), only the filter-capacitor-voltage actual values $v_C(k)$ and the dc-link voltage $E_d$ of a present sampling time need to be detected for the second type close-loop state observer. After calculation of the second type close-loop state observer through formulas (26) and (27), the filter-capacitor-voltage state variable values $\hat{v}_C(k+1)$, the filter-capacitor-current state variable values $\hat{i}_C(k+1)$, and the disturbance-voltage state variable values $\hat{v}_d(k+1)$ of a next sampling time may be calculated and retrieved. The filter-capacitor-voltage state variable values $\hat{v}_C(k+1)$, the filter-capacitor-current state variable values $\hat{i}_C(k+1)$, and the disturbance-voltage state variable values $\hat{v}_d(k+1)$ are predicted values at a next sampling time. Specially, the filter-capacitor-current state variable values $\hat{i}_C(k+1)$ are average current values without ripples. Therefore, there is no need to equip additional hardware circuitry or sensors for detecting the filter capacitor current. By using the sensorless second type close-loop state observer, costs of entire system or total circuitry relatively decrease. For a digital control system, calculation results of the second type close-loop state observer contribute predicted values of a next sampling time. As such, errors of sampling time may be reduced so that the overall performance of the digital control system is improved.

In above embodiments, load terminals are not fixed when the formula derivation is conducted. Therefore, the load current $i_L$ is an unknown value. In order to only reduce sampling errors, and make the whole system control be stable and consistent, a load current formula of a next sampling time for an on-grid mode is further derived and utilized. For the current prediction of load terminals, in accordance with FIG. 3, formula (28) is shown as follows.

$$v_d = v_C + v_e + L_f \dfrac{di_L}{dt} \Rightarrow \dfrac{di_L}{dt} = \dfrac{v_d - v_C - v_e}{L_f}, \quad \text{formula (28)}$$

Label $v_e$ represents to an error compensation voltage; and label $v_d$ represents a disturbance voltage. Label $v_C$ represents the filter capacitor voltage. Label $i_L$ represents a load current. Label $L_f$ represents the filter inductor. Assuming that a sampling period T serves as an integration time, formula (29) is derived by using an integral formula.

$$\hat{i}_L(k+1) = \quad \text{formula (29)}$$
$$i_L(k) + \dfrac{T}{2L_f}[\hat{v}_d(k+1) + \hat{v}_d(k) - \hat{v}_C(k+1) - \hat{v}_C(k) - 2V_e],$$

In formula (29), it assumes that label $V_e$ is a constant value in a sampling period T. Label $\hat{v}_d(k)$ refers to disturbance-voltage state variable values of a present sampling time. Label $\hat{v}_d(k+1)$ refers to disturbance-voltage state variable values of a next sampling time. Both of $\hat{v}_d(k)$ and $\hat{v}_d(k+1)$ are also calculation values of the state observers aforementioned (the first or second type close-loop state observer). Label $\hat{v}_C(k)$ represents filter-capacitor-voltage state variable values of a present sampling time. Label $\hat{v}_C(k+1)$ represents filter-capacitor-voltage state variable values of a next sampling time. Both of $\hat{v}_C(k)$ and $\hat{v}_C(k+1)$ are also calculation values of the state observers aforementioned. Label $\hat{i}_L(k+1)$ represents load-current state variable values of a next sampling time, which are also calculation values of the state observers aforementioned. Label $i_L(k)$ represents load-current actual values. Label $L_f$ represents the filter inductor. That is, formula (29) acts as a prediction formula for load-current state variable values $\hat{i}_L(k+1)$. Regardless of the first and second type close-loop state observers, the load current formula (29) is also applicable.

After the prediction formula for load-current state variable values $\hat{i}_L(k+1)$ is figured out, the control block diagram of FIG. 3 is reexamined. It may be seen that all controllable feedback values are predicted values of a next sampling time and those are all calculated by the state observers aforementioned. Further, the feed-forward-voltage state variable values $\hat{v}_{ff}(k+1)$ is obtained and calculated by using the predicted values, as shown in formula (30).

$$\hat{v}_{ff}(k+1) = \hat{v}_d(k+1)/E_d, \quad \text{formula (30)}$$

As such, errors of sampling time may be reduced so that the overall performance of the digital control system is improved.

Figure 4:
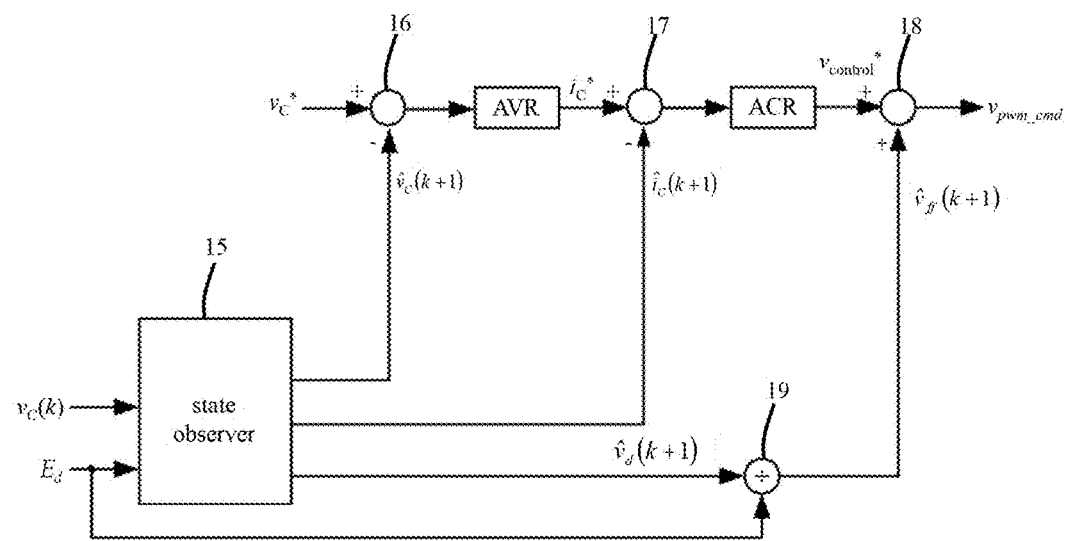
FIG. 4 illustrates a control flowchart of an off-grid mode in accordance with an embodiment of the present disclosure.
Figure 5:
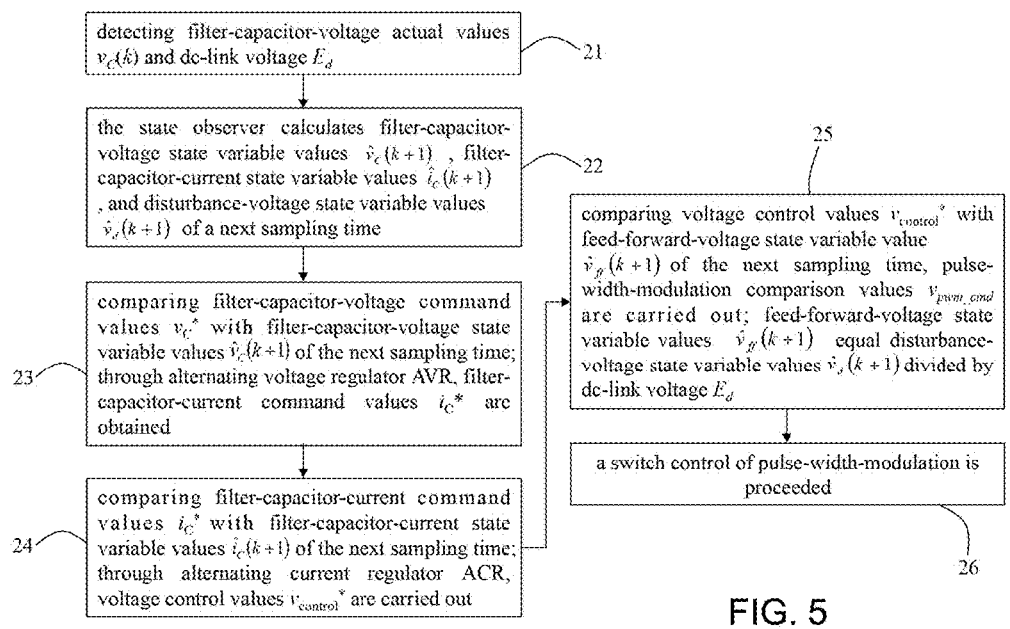
FIG. 5 illustrates steps of the control flowchart of the off-grid mode of FIG. 4.

The derived first and second type close-loop state observers are applicable to on-grid or off-grid DC-AC converters. FIG. 4 illustrates a control flowchart of an off-grid mode in accordance with an embodiment of the present disclosure. FIG. 5 illustrates steps of the control flowchart of the off-grid mode of FIG. 4. The first type close-loop-state-observer formula shown as formula (21) or the second type close-loop-state-observer formula shown as formula (27) is programmed into chips, which are capable of processing or computing. The chips are, for example, central processing units or microcontroller units, but not limited thereto. That is, a state observer 15 comprises formula (21), which indicates the first type close-loop state observer. In another embodiment, the state observer 15 comprises formula (27), which indicates the second type close-loop state observer.

The state observer 15 receives filter-capacitor-voltage actual values $v_C(k)$ and the dc-link voltage $E_d$ (actual values) of a present sampling time. After calculation by the state observer 15, filter-capacitor-voltage state variable values $\hat{v}_C(k+1)$, filter-capacitor-current state variable values $\hat{i}_C(k+1)$, and disturbance-voltage state variable values $\hat{v}_d(k+1)$ of a next sampling time may be calculated and output. The state variable values herein are predicted values at a next sampling time.

Other labels in FIG. 4 comprise such as filter-capacitor-voltage command values $v_C^*$, filter-capacitor-current command values $i_C^*$, voltage control values $v_{control}^*$, an alternating voltage regulator AVR, an alternating current regulator ACR, pulse-width-modulation comparison values $v_{pwm\_Cmd}$, adders 16, 17, and 18, and a divider 19.

In an embodiment, referring to the operations in FIG. 4, the state observer 15 receives one filter-capacitor-voltage actual value $v_C(k)$ and the dc-link voltage $E_d$ (an actual value) of a present sampling time. By using the state observer 15, a filter-capacitor-voltage state variable value $\hat{v}_C(k+1)$ is output, according to the filter-capacitor-voltage actual value $v_C(k)$ and the dc-link voltage $E_d$. The filter-capacitor-voltage state variable value $\hat{v}_C(k+1)$ is a predicted voltage value of a next sampling time. By using the state observer 15, a filter-capacitor-current state variable value $\hat{i}_C(k+1)$ is output. The filter-capacitor-current state variable value $\hat{i}_C(k+1)$ is a predicted current value of the next sampling time. The filter-capacitor-current state variable value $\hat{i}_C(k+1)$ is an average current value without ripples.

In an embodiment, referring to FIG. 4, a chip or a processor after programming may comprise the state observer 15. The state observer 15 is configured to retrieve a filter-capacitor-voltage actual value $v_C(k)$ and the dc-link voltage $E_d$ of a present sampling time. According to the filter-capacitor-voltage actual value $v_C(k)$ and the dc-link voltage $E_d$, the state observer 15 is configured to output a filter-capacitor-voltage state variable value $\hat{v}_C(k+1)$, a filter-capacitor-current state variable value $\hat{i}_C(k+1)$, and a disturbance-voltage state variable value $\hat{v}_d(k+1)$ of a next sampling time. The filter-capacitor-current state variable value $\hat{i}_C(k+1)$ is an average current value without ripples.

In an embodiment, the state observer 15 may comprise formula (21), which indicates the first type close-loop-state-observer formula. In another embodiment, the state observer 15 may comprise formula (27), which indicates the second type close-loop-state-observer formula.

Referring to FIG. 4 and FIG. 5, in step 21, by using external circuits or digital methods, filter-capacitor-voltage actual values $v_C(k)$ and the dc-link voltage $E_d$ (actual values) of a present sampling time are detected. The state observer 15 receives the filter-capacitor-voltage actual values $v_C(k)$ and the dc-link voltage $E_d$.

In step 22, the filter-capacitor-voltage actual values $v_C(k)$ and the dc-link voltage $E_d$ are input to the state observer 15. The state observer 15 calculates and outputs filter-capacitor-voltage state variable values $\hat{v}_C(k+1)$ filter-capacitor-current state variable values $\hat{i}_C(k+1)$, and disturbance-voltage state variable values $\hat{v}_d(k+1)$ of a next sampling time. In other words, in the state observer 15, the filter-capacitor-voltage actual values $v_C(k)$ and the dc-link voltage $E_d$ are substituted into formula (21) for further calculation. Wherein formula (21) represents the first type close-loop state observer. In another embodiment, in the state observer 15, the filter-capacitor-voltage actual values $v_C(k)$ and the dc-link voltage $E_d$ are substituted into formula (27) for further calculation. Wherein formula (27) represents the second type close-loop state observer. The state observer 15 outputs the filter-capacitor-voltage state variable values $\hat{v}_C(k+1)$ of a next sampling time to the adder 16. The state observer 15 outputs the filter-capacitor-current state variable values $\hat{i}_C(k+1)$ of the next sampling time to the adder 17. The state observer 15 outputs the disturbance-voltage state variable values $\hat{v}_d(k+1)$ of the next sampling time to the divider 19.

In step 23, the adder 16 compares filter-capacitor-voltage command values $v_C^*$ with the filter-capacitor-voltage state variable values $\hat{v}_C(k+1)$ of the next sampling time. Through the alternating voltage regulator AVR, filter-capacitor-current command values $i_C^*$ are obtained.

In step 24, the adder 17 compares the filter-capacitor-current command values $i_C^*$ with the filter-capacitor-current state variable values $\hat{i}_C(k+1)$ of the next sampling time. Through the alternating current regulator ACR, voltage control values $v_{control}^*$ are obtained.

In step 25, the adder 18 compares the voltage control values $v_{control}^*$ with feed-forward-voltage state variable values $\hat{v}_{ff}(k+1)$ of the next sampling time. Later, pulse-width-modulation comparison values $v_{pwm\_cmd}$ are obtained. The feed-forward-voltage state variable values $\hat{v}_{ff}(k+1)$ equal the disturbance-voltage state variable values $\hat{v}_d(k+1)$ divided by the dc-link voltage $E_d$.

In step 26, according to the pulse-width-modulation comparison values $v_{pwm\_cmd}$, a switch control of pulse-width-modulation is proceeded.

As aforesaid, the sensorless state observer 15 is applicable to an off-grid mode of control system. By the state observer 15, only the filter-capacitor-voltage actual values $v_C(k)$ and the dc-link voltage $E_d$ (actual values) of a present sampling time need to be detected. After calculation by the state observer 15, the filter-capacitor-voltage state variable values $\hat{v}_C(k+1)$, the filter-capacitor-current state variable values $\hat{i}_C(k+1)$, and the disturbance-voltage state variable values $\hat{v}_d(k+1)$ of next sampling time may be calculated and output. These state variable values are predicted values at the next sampling time. Specially, the filter-capacitor-current state variable values $\hat{i}_C(k+1)$ are average current values without ripples. As such, there is no need to equip additional hardware circuitry or sensors, the filter capacitor current may be predicted. Therefore, by using sensorless state observer 15, costs of off-grid mode of a control system relatively decrease. Besides, for the off-grid mode of the control system using the state observer 15, feedback values all adopt predicted values so that errors of sampling time may be reduced. Overall performance of the off-grid mode of the control system is improved. Parameters in formula (21) or formula (27) of the state observer 15 are controllable factors, such as the sampling period T, the filter inductor $L_f$, the filter capacitor $C_f$, and the system modulation indexes $u(k)$. The state variable values output from the state observer 15 have high accuracy and are predictive values. In addition, the off-grid mode in FIG. 4 and FIG. 5 are controlled by the filter capacitor current, which has a better system response.

Besides, by using digital control, calculation results of the state observer 15 reduce errors of sampling time.

Figure 6:
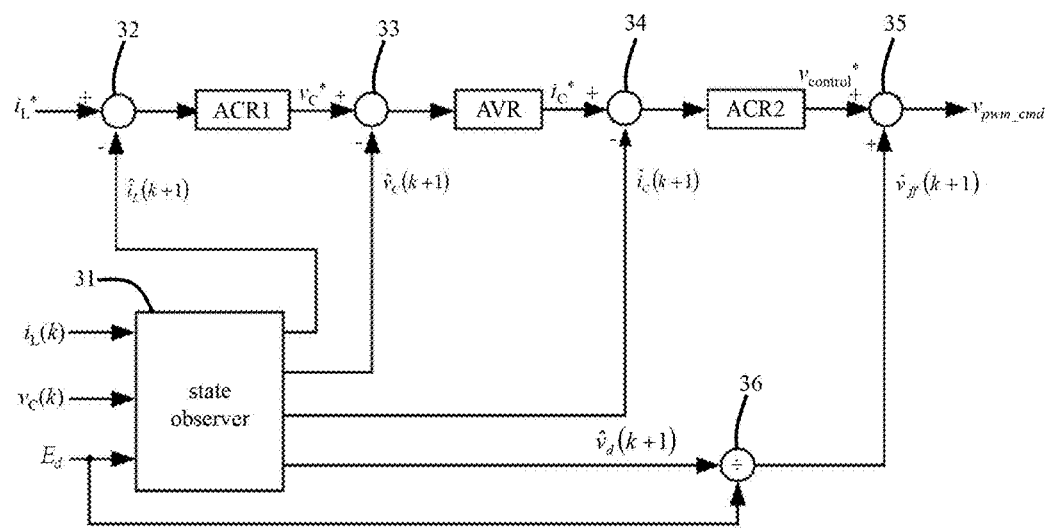
FIG. 6 illustrates a control flowchart of an on-grid mode in accordance with an embodiment of the present disclosure.
Figure 7:
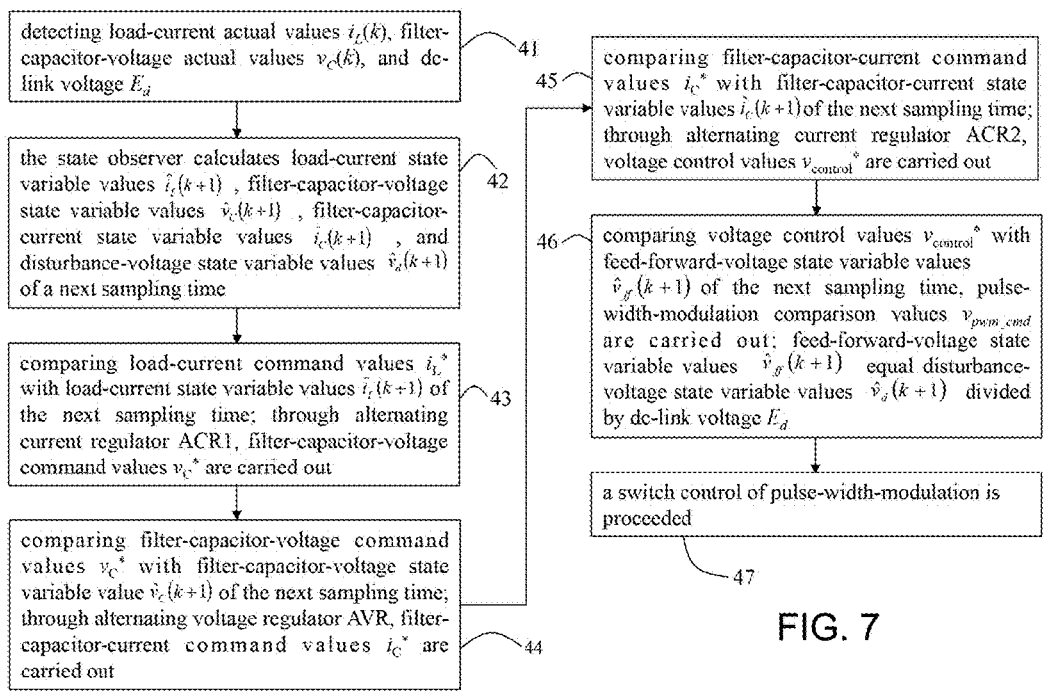
FIG. 7 illustrates steps of the control flowchart of the on-grid mode of FIG. 6.

FIG. 6 illustrates a control flowchart of an on-grid mode in accordance with an embodiment of the present disclosure. FIG. 7 illustrates steps of the control flowchart of the on-grid mode of FIG. 6. In an embodiment, referring to FIG. 6, formula (21) and formula (29) are programmed into chips or processors having the computing capability. Wherein formula (21) refers to the first type close-loop-state-observer formula, and formula (29) calculates load-current state variable values $\hat{i}_L(k+1)$. In another embodiment, formula (27) and formula (29) are programmed into chips or processors having the computing capability. Wherein formula (27) represents the second type close-loop-state-observer formula. The chips or processors are, for example, central processing units or microcontroller units, but not limited thereto. That is, a state observer 31 may comprise both formula (21) and formula (29). In another embodiment, the state observer 31 may comprise both formula (27) and formula (29).

The state observer 31 receives load-current actual values $i_L(k)$, filter-capacitor-voltage actual values $v_C(k)$, and the dc-link voltage $E_d$ (actual values) of a present sampling time. After calculation by the state observer 31, the load-current state variable values $\hat{i}_L(k+1)$ of a next sampling time are output and transmitted to an adder 32. The filter-capacitor-voltage state variable values $\hat{v}_C(k+1)$ of the next sampling time are output and transmitted to an adder 33. The filter-capacitor-current state variable values $\hat{i}_C(k+1)$ of the next sampling time are output and transmitted to an adder 34. The disturbance-voltage state variable values $\hat{v}_d(k+1)$ of the next sampling time are output and transmitted to a divider 36. The state variable values herein are predicted values at a next sampling time.

Other labels in FIG. 6 comprise the load-current command values $i_L^*$, the filter-capacitor-voltage command values $v_C^*$, the filter-capacitor-current command values $i_C^*$, the voltage control values $v_{control}^*$, the alternating voltage regulator AVR, the alternating current regulators ACR1 and ACR2, the pulse-width-modulation comparison values $v_{pwm\_cmd}$, the feed-forward-voltage state variable values $\hat{v}_{ff}(k+1)$, the adders 32, 33, 34, and 35, and a divider 36.

Referring to FIG. 6 and FIG. 7, in step 41, by using external circuitry or digital methods, a load-current actual value $i_L(k)$, a filter-capacitor-voltage actual value $v_C(k)$, and the dc-link voltage $E_d$ of a present sampling time are detected. A state observer 31 receives the load-current actual value $i_L(k)$, the filter-capacitor-voltage actual value $v_C(k)$, and the dc-link voltage $E_d$. Specially, a difference between the state observers 15 and 31 is that the state observer 31 further receives the load-current actual value $i_L(k)$. In the state observer 31, the load-current actual value $i_L(k)$, the filter-capacitor-voltage actual value $v_C(k)$, and the dc-link voltage $E_d$ are substituted into formulas (21) and (29). Wherein formula (21) represents the first type close-loop-state-observer formula, and formula (29) calculates the load-current state variable values $\hat{i}_L(k+1)$. In another embodiment, in the state observer 31, the load-current actual value $i_L(k)$, the filter-capacitor-voltage actual value $v_C(k)$, and the dc-link voltage $E_d$ are substituted into formulas (27) and (29). Wherein formula (27) represents the second type close-loop-state-observer formula.

In step 42, after calculation by the state observer 31, the load-current state variable values $\hat{i}_L(k+1)$ of a next sampling time are output and transmitted to the adder 32. The filter-capacitor-voltage state variable values $\hat{v}_C(k+1)$ of the next sampling time are output and transmitted to the adder 33.

The filter-capacitor-current state variable values $\hat{i}_C(k+1)$ of the next sampling time are output and transmitted to the adder 34. The disturbance-voltage state variable value $\hat{v}_d(k+1)$ of the next sampling time are output and transmitted to the divider 36.

In step 43, the adder 32 compares the load-current command values $i_L^*$ with the load-current state variable values $\hat{i}_L(k+1)$ of the next sampling time. Through the alternating current regulator ACR1, the filter-capacitor-voltage command values $v_C^*$ are obtained.

In step 44, the adder 33 compares the filter-capacitor-voltage command values $v_C^*$ with the filter-capacitor-voltage state variable value $\hat{v}_C(k+1)$ of the next sampling time. Through the alternating voltage regulator AVR, the filter-capacitor-current command values $i_C^*$ are obtained.

In step 45, the adder 34 compares the filter-capacitor-current command values $i_C^*$ with the filter-capacitor-current state variable values $\hat{i}_C(k+1)$ of the next sampling time. Through the alternating current regulator ACR2, the voltage control values $v_{control}^*$ are obtained.

In step 46, the adder 35 compares the voltage control values $v_{control}^*$ with feed-forward-voltage state variable values $\hat{v}_{ff}(k+1)$ of the next sampling time. Later, pulse-width-modulation comparison values $v_{pwm\_cmd}$ are obtained. The feed-forward-voltage state variable values $\hat{v}_{ff}(k+1)$ equal the disturbance-voltage state variable values $\hat{v}_d(k+1)$ divided by the dc-link voltage $E_d$.

In step 47, according to the pulse-width-modulation comparison values $v_{pwm\_cmd}$, a switch control of pulse-width-modulation is proceeded.

As aforesaid, the sensorless state observer 31 is applicable to an on-grid mode of control system. By the state observer 31, only the load-current actual values $i_L(k)$, the filter-capacitor-voltage actual values $v_C(k)$, and the dc-link voltage $E_d$ of a present sampling time need to be obtained. After calculation by the state observer 31, the load-current state variable values $\hat{i}_L(k+1)$, filter-capacitor-voltage state variable values $\hat{v}_C(k+1)$, filter-capacitor-current state variable values $\hat{i}_C(k+1)$, and the disturbance-voltage state variable values $\hat{v}_d(k+1)$ of a next sampling time may be calculated and obtained. The above state variable values are predicted values at the next sampling time. Specially, the filter-capacitor-current state variable values $\hat{i}_C(k+1)$ are average current values without ripples. As such, there is no need to equip additional hardware circuitry or sensors for detecting the filter capacitor current. Therefore, by using the sensorless state observer 31, costs of on-grid mode of a control system relatively decrease. Besides, for the on-grid mode of the control system using the sensorless state observer 31, feedback values all adopt predicted values so that errors of sampling time may be reduced. Overall performance of on-grid mode of the control system is improved.

Parameters in formula (21), formula (27), and formula (29) of the state observer 31 are controllable factors, such as the sampling period T, the filter inductor $L_f$, the filter capacitor $C_f$, a filter angular frequency $\omega_f$, and the system modulation indexes $u(k)$. The state variable values output from the state observer 31 have high accuracy and are predictive values. In addition, the on-grid mode in FIG. 6 and FIG. 7 are controlled by the filter capacitor current, which has a better system response. Besides, by using digital control, calculation results of the state observer 31 reduce errors of sampling time.

Figure 8:
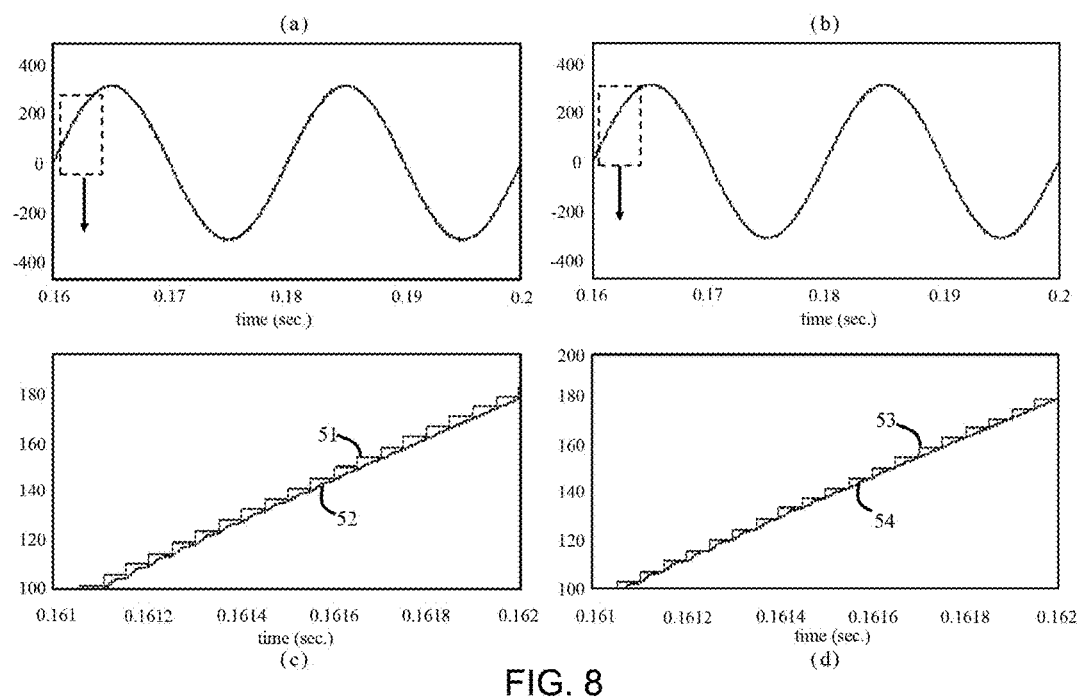
FIG. 8 illustrates waveform diagrams of filter capacitor voltage of a first and a second type close-loop state observers in accordance with an embodiment of the present disclosure.

The first type close-loop state observer and the second type open-loop state observer are simulated and compared. FIG. 8 illustrates waveform diagrams of the filter capacitor voltage of the first and second type close-loop state observers in accordance with an embodiment of the present disclosure. In FIG. 8, horizontal axes of diagrams (a), (b), (c), and (d) indicate time, which is measured in seconds. Vertical axes of diagrams (a), (b), (c), and (d) indicate voltage, which is measure in volts. The diagram (a) shows a simulation result of a first type close-loop state observer, which adopts the first type close-loop-state-observer formula shown as formula (21). The diagram (c) shows an enlarge view of a dash block of the diagram (a). The diagram (b) shows a simulation result of a second type close-loop state observer, which adopts the second type close-loop-state-observer formula shown as formula (27). The diagram (d) shows an enlarge view of a dash block of the diagram (b).

In the diagram (c) of FIG. 8, a sawtooth curve represents filter capacitor voltage values 51. The filter capacitor voltage values 51 are calculated by the first type close-loop-state-observer formula shown as formula (21). The filter capacitor voltage values 51 are regarded as filter-capacitor-voltage state variable values $\hat{v}_C(k+1)$ aforementioned, which are obtained from formula (21). The formation of the sawtooth wave results from sampling and holding. Irregular slashes beneath the sawtooth wave represent continuous filter capacitor voltage values 52. The continuous filter capacitor voltage values 52 also refers to actual physical quantities.

In the diagram (d) of FIG. 8, a sawtooth curve represents filter capacitor voltage values 53. The filter capacitor voltage values 53 are calculated by the second type close-loop-state-observer formula shown as formula (27). The filter capacitor voltage values 53 are regarded as filter-capacitor-voltage state variable values $\hat{v}_C(k+1)$ aforementioned, which are obtained from formula (27). The sawtooth wave results from sampling and holding. Irregular slashes beneath the sawtooth wave represent continuous filter capacitor voltage values 54. The continuous filter capacitor voltage values 54 also refer to actual physical quantities. In comparison with the diagram (c) of FIG. 8, the filter capacitor voltage values 53 is much closer to the filter capacitor voltage values 54. As such, calculation results of the second type close-loop state observer are more accurate than those of the first type close-loop state observer.

Figure 9:
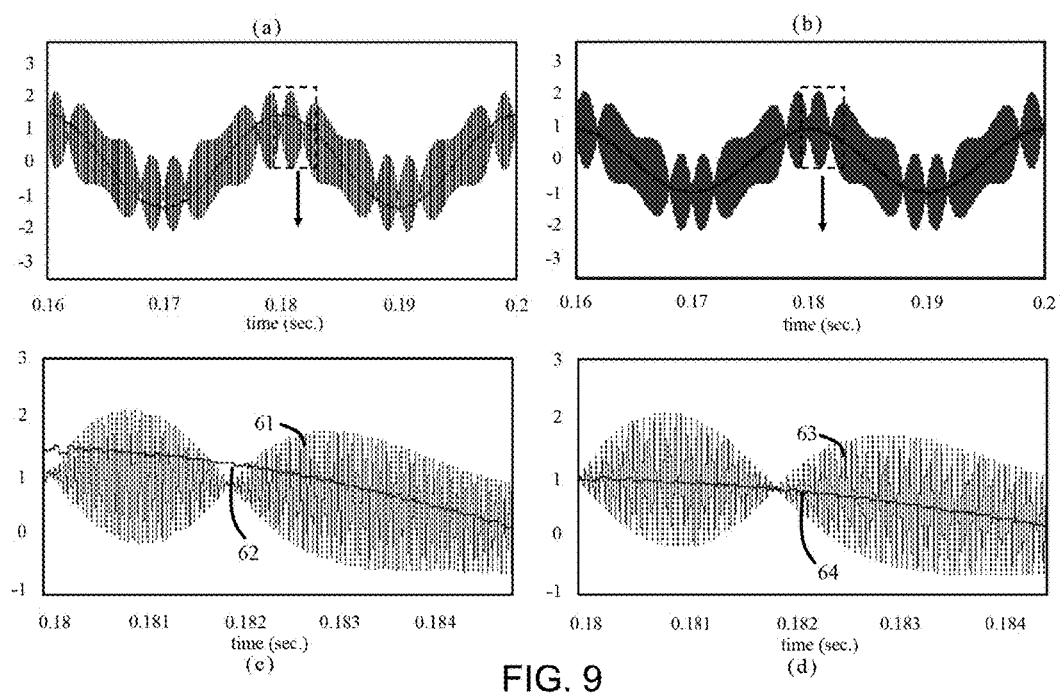
FIG. 9 illustrates waveform diagrams of filter capacitor current of the first and the second type close-loop state observers in accordance with an embodiment of the present disclosure.

FIG. 9 illustrates waveform diagrams of filter capacitor current of the first and second type close-loop state observers, in accordance with an embodiment of the present disclosure. In FIG. 9, horizontal axes of diagrams (a), (b), (c), and (d) indicate time, which is measured in seconds. Vertical axes of diagrams (a), (b), (c), and (d) indicate current, which is measure in amperes. The diagram (a) shows a simulation result of the first type close-loop state observer, which adopts the first type close-loop-state-observer formula shown as formula (21). The diagram (c) shows an enlarge view of a dash block of the diagram (a). The diagram (b) shows a simulation result of the second type close-loop state observer, which adopts the second type close-loop-state-observer formula shown as formula (27). The diagram (d) shows an enlarge view of a dash block of the diagram (b).

In the diagram (c) of FIG. 9, ripples represent continuous filter capacitor current values 61. The filter capacitor current values 61 also refer to actual physical quantities. A smooth curve represents filter capacitor current values 62. The filter capacitor current values 62 are calculated by the first type close-loop-state-observer formula shown as formula (21). The filter capacitor current values 62 are predicated values and regarded as filter-capacitor-current state variable values $\hat{i}_C(k+1)$ aforementioned, which are obtained from formula (21). Specially, the filter capacitor current values 62 are average current values without ripples.

In the diagram (d) of FIG. 9, ripples represent continuous filter capacitor current values 63. The filter capacitor current values 63 also refer to actual physical quantities. A smooth curve represents filter capacitor current values 64. The filter capacitor current values 64 are calculated by the second type close-loop-state-observer formula shown as formula (27). The filter capacitor current values 64 are predicted values and regarded as filter-capacitor-current state variable values $\hat{i}_C(k+1)$ aforementioned, which are obtained from formula (27). Specially, the filter capacitor current values 64 are average current values without ripples.

In comparison with the diagram (c) of FIG. 9, the filter capacitor current values 64 are much closer to average current values of the filter capacitor current values 63. As such, calculation results of the second type close-loop state observer are more accurate than those of the first type close-loop state observer. When the accuracy is higher, a control system is more stable so that the whole performance of the control system is improved.

In brief, the present disclosure provides sensorless measurement method and device for filter capacitor current by using a state observer. Sensorless first and second type close-loop state observer are provided. There is no need to equip additional hardware circuitry or sensors for the filter capacitor current so that costs of a control system relatively decrease. In addition, values of the filter capacitor current output from the state observers are average current values without ripples. Further, state variable values output from the state observers are predicted values at a next sampling time. Errors of sampling time may be reduced so that overall performance of a digital control system is improved.

In practice, only the filter capacitor voltage, the dc-link voltage, and the load current (for on-grid modes) of a present sampling time need to be detected. After calculation by a state observer, the load current, the filter capacitor voltage, the filter capacitor current, and the disturbance voltage of a next sampling time may be calculated and predicted. There is no need to directly detect the filter capacitor current of a present sampling time, but still obtain the filter capacitor current of a next sampling time. In addition, the predicated values of the filter capacitor current are average current values without ripples.

On the other hand, the sensorless first and second type close-loop state observers are respectively applicable to an on-grid mode or an off-grid mode of a control system. Feedback values of the control system all adopt predicted values so that errors of sampling time may be reduced. The overall performance of on-grid modes or off-grid mode of the control system is improved. Further, since the load current in the sensorless first and second type close-loop state observers is not fixed, the state observers are applicable to the on-grid mode or the off-grid mode. Parameters in the sensorless first and second type close-loop-state-observer formulas are controllable factors. The state variable values output from the state observers have a high accuracy and are predictable values. In addition, the on-grid mode and the off-grid mode are controlled by the filter capacitor current, which has a better system response. Besides, since the sensorless first and second type close-loop state observers are applied to a digital control system, calculation results of the state observers reduce errors of sampling time.

It will be apparent to those skilled in the art that various modifications and variations can be made to the disclosed embodiments. It is intended that the specification and examples be considered as exemplars only, with a true scope of the disclosure being indicated by the following claims and their equivalents.

What is claimed is:

1. A sensorless measurement method for filter-capacitor-current by using a state observer, comprising:
   receiving a filter-capacitor-voltage actual value of a present sampling time;
   receiving a direct current link (dc-link) voltage of the present sampling time;
   outputting, by the state observer, a filter-capacitor-voltage state variable value, according to the filter-capacitor-voltage actual value and the dc-link voltage, wherein the filter-capacitor-voltage state variable value is a predicted voltage value of a next sampling time; and
   outputting, by the state observer, a filter-capacitor-current state variable value, wherein the filter-capacitor-current state variable value is a predicted current value of the next sampling time, and the filter-capacitor-current state variable value is an average current value without ripples.

2. The sensorless measurement method of claim 1, comprising:
   outputting, by the state observer, a disturbance-voltage state variable value, wherein the disturbance-voltage state variable value is a predicted voltage value of the next sampling time.

3. The sensorless measurement method of claim 1, comprising:
   receiving a load-current actual value of the present sampling time; and
   outputting, by the state observer, a load-current state variable value, according to the load-current actual value, wherein the load-current state variable value is a predicted current value of the next sampling time.

4. A sensorless measurement method for filter capacitor current by using a state observer, comprising:
   detecting a filter-capacitor-voltage actual value and a direct current link (dc-link) voltage of a present sampling time;
   calculating, by the state observer, a filter-capacitor-voltage state variable value, a filter-capacitor-current state variable value, and a disturbance-voltage state variable value of a next sampling time;
   comparing a filter-capacitor-voltage command value with the filter-capacitor-voltage state variable value, and obtaining a filter-capacitor-current command value;
   comparing the filter-capacitor-current command value with the filter-capacitor-current state variable value, and obtaining a voltage control value;
   comparing the voltage control value with a feed-forward-voltage state variable value, and obtaining a pulse-width-modulation comparison value, wherein the feed-forward-voltage state variable value equals the disturbance-voltage state variable value divided by the dc-link voltage; and
   proceeding a switch control of pulse-width-modulation according to the pulse-width-modulation comparison value.

5. The sensorless measurement method of claim 4, comprising:
   detecting a load-current actual value of the present sampling time;
   calculating, by the state observer, a load-current state variable value of a next sampling time; and
   comparing a load-current command value with the load-current state variable value, and obtaining the filter-capacitor-voltage command value.

6. A sensorless measurement device for filter capacitor current by using a state observer, comprising:

a chip comprising the state observer, wherein the state observer is configured to retrieve a filter-capacitor-voltage actual value and a direct current link (dc-link) voltage of a present sampling time, according to the filter-capacitor-voltage actual value and the dc-link voltage; and configured to output a filter-capacitor-voltage state variable value, a filter-capacitor-current state variable value, and a disturbance-voltage state variable value of a next sampling time, wherein the filter-capacitor-current state variable value is an average current value without ripples.

7. The sensorless measurement device of claim 6, wherein the state observer is configured to obtain a load-current actual value of the present sampling time, according to the load-current actual value, and configured to output a load-current state variable value of the next sampling time.

8. The sensorless measurement device of claim 7, wherein the state observer comprises a formula of calculating the load-current state variable value as follows:

$$\hat{i}_L(k+1) = i_L(k) + \frac{T}{2L_f}[\hat{v}_d(k+1) + \hat{v}_d(k) - \hat{v}_C(k+1) - \hat{v}_C(k) - 2V_e],$$

wherein $\hat{i}_L(k+1)$ is the load-current state variable value of the next sampling time, T is a sampling period, $\hat{v}_C(k)$ is a filter-capacitor-voltage state variable value of the present sampling time, $\hat{v}_C(k+1)$ is the filter-capacitor-voltage state variable value of the next sampling time, $\hat{v}_d(k)$ is a disturbance-voltage state variable value of the present sampling time, $\hat{v}_d(k+1)$ is the disturbance-voltage state variable value of the next sampling time, $i_L(k)$ is the load-current actual value of the present sampling time, $V_e$ is an error compensation, and $L_f$ is a filter inductor.

9. The sensorless measurement device of claim 6, wherein the state observer comprises a first type close-loop-state-observer formula as follows:

$$\begin{pmatrix} \hat{v}_C(k+1) \\ \hat{i}_C(k+1) \\ \hat{v}_d(k+1) \end{pmatrix} = \begin{pmatrix} -2 & T/C_f & -T^2/2L_fC_f \\ -5C_f/2T & 1 & -T/L_f \\ L_fC_f/T^2 & 0 & 1 \end{pmatrix} \begin{pmatrix} \hat{v}_C(k) \\ \hat{i}_C(k) \\ \hat{v}_d(k) \end{pmatrix} + \begin{pmatrix} T^2/2L_fC_f \\ T/L_f \\ 0 \end{pmatrix} E_d u(k) + \begin{pmatrix} 3 \\ 5C_f/2T \\ -L_fC_f/T^2 \end{pmatrix} v_C(k)$$

wherein $\hat{v}_C(k)$ is a filter-capacitor-voltage state variable value of the present sampling time, $\hat{v}_C(k+1)$ is the filter-capacitor-voltage state variable value of the next sampling time, $\hat{i}_C(k)$ is a filter-capacitor-current state variable value of the present sampling time, $\hat{i}_C(k+1)$ is the filter-capacitor-current state variable value of the next sampling time, $\hat{v}_d(k)$ is a disturbance-voltage state variable value of the present sampling time, $\hat{v}_d(k+1)$ is the disturbance-voltage state variable value of the next sampling time, $v_C(k)$ is the filter-capacitor-voltage actual value of the present sampling time, T is a sampling period, $E_d$ is the dc-link voltage, u(k) is a system modulation index, $L_f$ is a filter inductor, and $C_f$ is a filter capacitor.

10. The sensorless measurement device of claim 6, wherein the state observer comprises a second type close-loop-state-observer formula as follows:

$$\begin{pmatrix} \hat{v}_C(k+1) \\ \hat{i}_C(k+1) \\ \hat{v}_d(k+1) \end{pmatrix} =$$

$$\begin{pmatrix} -2\cos\omega_f T & \dfrac{\sin\omega_f T}{\omega_f C_f} & \cos\omega_f T - 1 \\ -\dfrac{\omega_f C_f(4\cos^2\omega_f T + 2\cos\omega_f T - 1)}{2\sin\omega_f T} & \cos\omega_f T & -\dfrac{\sin\omega_f T}{\omega_f L_f} \\ -\dfrac{(2\cos\omega_f T - 4\cos^2\omega_f T + 1)}{2(1 - \cos\omega_f T)} & \dfrac{\sin\omega_f T}{\omega_f C_f} & \cos\omega_f T \end{pmatrix} \begin{pmatrix} \hat{v}_C(k) \\ \hat{i}_C(k) \\ \hat{v}_d(k) \end{pmatrix} +$$

$$\begin{pmatrix} 1 - \cos\omega_f T \\ \dfrac{\sin\omega_f T}{\omega_f L_f} \\ 1 - \cos\omega_f T \end{pmatrix} E_d u(k) + \begin{pmatrix} 1 + 2\cos\omega_f T \\ \dfrac{\omega_f C_f(4\cos^2\omega_f T + 2\cos\omega_f T - 1)}{2\sin\omega_f T} \\ \dfrac{(2\cos\omega_f T - 4\cos^2\omega_f T + 1)}{2(1 - \cos\omega_f T)} \end{pmatrix} v_C(k)$$

wherein $\hat{v}_C(k)$ is a filter-capacitor-voltage state variable value of the present sampling time, $\hat{v}_C(k+1)$ is the filter-capacitor-voltage state variable value of the next sampling time, $\hat{i}_C(k)$ is a filter-capacitor-current state variable value of the present sampling time, $\hat{i}_C(k+1)$ is the filter-capacitor-current state variable value of the next sampling time, $\hat{v}_d(k)$ is a disturbance-voltage state variable value of the present sampling time, $\hat{v}_d(k+1)$ is the disturbance-voltage state variable value of the next sampling time, $v_C(k)$ is the filter-capacitor-voltage actual value of the present sampling time, T is a sampling period, $E_d$ is the dc-link voltage, u(k) is a system modulation index, $L_f$ is a filter inductor, $C_f$ is a filter capacitor, and $\omega_f$ is a filter angular frequency.

11. The sensorless measurement device of claim 6, wherein the state observer comprises a formula of calculating a feed-forward-voltage state variable value as follows:

$$\hat{v}_{ff}(k+1) = \hat{v}_d(k+1)/E_d$$

wherein $\hat{v}_{ff}(k+1)$ is the feed-forward-voltage state variable value of the next sampling time, $\hat{v}_d(k+1)$ is the disturbance-voltage state variable value of the next sampling time, and $E_d$ is the dc-link voltage.

* * * * *